United States Patent
Yang et al.

(10) Patent No.: US 8,387,233 B2
(45) Date of Patent: Mar. 5, 2013

(54) SYSTEM FOR ASSEMBLING COMPONENTS ON A CIRCUIT BOARD

(75) Inventors: Jun-Min Yang, Taipei Hsien (TW); Hao-Chun Hsieh, Taipei Hsien (TW); Hsin-Lun Tsai, Taipei Hsien (TW); Chia-Hsien Lee, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 421 days.

(21) Appl. No.: 12/694,293

(22) Filed: Jan. 27, 2010

(65) Prior Publication Data
US 2011/0016708 A1    Jan. 27, 2011

(30) Foreign Application Priority Data
Jul. 23, 2009 (TW) ................................ 98124854 A (51) Int. Cl.
*B23P 19/00* (2006.01)
*H05K 13/04* (2006.01)
(52) U.S. Cl. ................ 29/729; 29/739; 29/742
(58) Field of Classification Search ............ 29/700, 29/729, 739–742, 759–760, 783, 791; 174/250–252, 174/255–263; 198/412–414, 817
See application file for complete search history.

(56) References Cited

U.S. PATENT DOCUMENTS

| | | | | |
|---|---|---|---|---|
| 3,722,062 A * | 3/1973 | Gharaibeh | ................ | 29/703 |
| 3,789,483 A * | 2/1974 | De Vita et al. | ................ | 29/701 |
| 4,573,262 A * | 3/1986 | Dornes et al. | ................ | 29/739 |
| 4,670,978 A * | 6/1987 | Fickes et al. | ................ | 29/741 |
| 4,705,081 A * | 11/1987 | Birk et al. | ................ | 140/147 |
| 4,910,859 A * | 3/1990 | Holcomb | ................ | 29/564.2 |
| 4,938,334 A * | 7/1990 | McGinn | ................ | 198/346.1 |
| 5,009,306 A * | 4/1991 | Roderick et al. | ................ | 198/414 |
| 5,329,690 A * | 7/1994 | Tsuji et al. | ................ | 29/701 |
| 5,873,155 A * | 2/1999 | Jokela | ................ | 29/33 P |
| 6,018,865 A * | 2/2000 | Michael | ................ | 29/740 |
| 6,032,788 A * | 3/2000 | Smithers et al. | ................ | 198/817 |
| 6,199,272 B1 * | 3/2001 | Seto et al. | ................ | 29/740 |
| 6,260,260 B1 * | 7/2001 | Suhara | ................ | 29/740 |
| 6,660,563 B1 * | 12/2003 | Cromwell et al. | ................ | 438/118 |
| 7,077,262 B2 * | 7/2006 | Kabeshita et al. | ................ | 198/817 |
| 7,171,742 B2 * | 2/2007 | Cromwell et al. | ................ | 29/740 |
| 7,475,472 B2 * | 1/2009 | Haarberg et al. | ................ | 29/739 |
| 8,018,733 B2 * | 9/2011 | Jia | ................ | 361/788 |
| 2003/0224558 A1 * | 12/2003 | Cromwell et al. | ................ | 438/118 |
| 2004/0088853 A1 * | 5/2004 | Cromwell et al. | ................ | 29/739 |
| 2006/0053341 A1 * | 3/2006 | Haarberg et al. | ................ | 714/34 |
| 2011/0016708 A1 * | 1/2011 | Yang et al. | ................ | 29/832 |

* cited by examiner

*Primary Examiner* — David Angwin
(74) *Attorney, Agent, or Firm* — Winston Hsu; Scott Margo (57) ABSTRACT

A circuit board assembling system includes a circuit board whereon a slot is formed. The circuit board includes a first region and a second region. The circuit board assembling system further includes a component placement machine, a positioning rod, wherein a first width of the unadjusted positioning rod is larger than a width of the slot so that the unadjusted positioning rod can not pass through the slot, a conveying device for driving the circuit board to a positioning point in a first direction and driving the circuit board to an assembling position in a second direction, and a control unit for controlling the conveying device to drive the circuit board to the assembling position in the second direction and controlling the component placement machine to assemble a first component set and a second component set on the first region and the second region respectively.

9 Claims, 12 Drawing Sheets

SYSTEM FOR ASSEMBLING COMPONENTS ON A CIRCUIT BOARD

BACKGROUND OF THE INVENTION

1. Field of the Invention

The present invention relates to a method for assembling components on a circuit board and a related assembling system, and more particularly, to a method for respectively assembling components on different regions of a circuit board and a related assembling system.

2. Description of the Prior Art

Surface mounting technology is a kind of welding technology utilized generally in recent years, which uses specific tools to position surface mounting elements on welded printed circuit board or bound printed circuit board accurately. After welding, fine mechanical connection and electrical connection can be set up between the elements and the circuit board. Main process of the conventional surface mounting technology is divided with solder printing, solder printing detecting, high speed component placement, general component placement, soldering stove, optical detecting, and so on. In current manufacturing process, width of the printed circuit board is limited to width of a track (around 460 mm), and the width of the track is designed according to minimum width of equipment. Therefore, the width of the track is invariable without adjusting equipment. Length of the printed circuit board is limited to dimensions of a platform of a high-speed component placement machine (around 510 mm). That is to say, limitation of the length and the width of the printed circuit board are 510 mm and 460 mm respectively with conventional process of the surface mounting technology, and it limits the possible maximum dimensions of the printed circuit board.

For example, working principle of the conventional high-speed component placement machine is conveying the printed circuit board to a positioning point to touch a rod, moving the printed circuit board away by the high-speed component placement machine after a detector detects the printed circuit board, setting components on the printed circuit board and backing the printed circuit board to the initial place, and conveying the printed circuit board to a next working station by a conveying belt. Due to limitation of the platform of the high-speed component placement machine, the dimensions of the printed circuit board can not be manufactured over 510 mm in length and 460 mm in width, due to the limitation of the component placement machine. Because dimensions of the component placement platform are fixed, when a setting area of components is over than the dimensions of the platform, the printed circuit board can not be manufactured except upgrading new equipments, such as adding extra equipments on the next working station of production lines. However, upgrading the production lines for manufacturing larger dimensions of the printed circuit board spends a lot. Due to advanced demands of the printed circuit board of a server, the dimensions of the printed circuit board is expanded continuously, and actual design is limited to manufacturing limitation. Thus, how to overcome the limitation and to enlarge the manufacturing dimensions is an important issue for the printed circuit board industry.

SUMMARY OF THE INVENTION

The present invention provides a method for assembling components on a circuit board and a related assembling system for solving above drawbacks.

According to the claimed invention, a method for assembling components on a circuit board, the method includes forming a slot on the circuit board, driving the circuit board in a first direction, driving the circuit board to an assembling position in a second direction different from the first direction after the circuit board is blocked at a positioning point by a positioning rod, wherein a first width of the unadjusted positioning rod is larger than a width of the slot so that the unadjusted positioning rod can not pass through the slot, assembling a first component set on a first region of the circuit board when the circuit board is positioned in the assembling position, adjusting the positioning rod to a second width being smaller than the first width, wherein the second width is smaller than the width of the slot, driving the circuit board back to the positioning point after assembling the first component set on the circuit board, driving the circuit board in the first direction until the positioning rod reaches an end of the slot, driving the circuit board to the assembling position in the second direction when the positioning rod reaches the end of the slot, and assembling a second component set on a second region of the circuit board when the circuit board is positioned in the assembling position.

According to the claimed invention, forming the slot on the circuit board includes forming the slot on a side of a cut edge of the circuit board.

According to the claimed invention, the first direction is perpendicular to the second direction substantially.

According to the claimed invention, assembling the first component set on the first region of the circuit board includes setting the first component set on the first region of the circuit board with surface mounting technology.

According to the claimed invention, assembling the first component set on the first region of the circuit board includes setting the first component set on the first region of the circuit board by a component placement machine.

According to the claimed invention, adjusting the positioning rod to the second width being smaller than the first width includes rotating two pivoting components of the positioning rod relative to a shaft so as to fold the positioning rod to the second width being smaller than the first width.

According to the claimed invention, rotating the two pivoting components of the positioning rod relative to the shaft includes rotating the two pivoting components of the positioning rod relative to the shaft to the first direction.

According to the claimed invention, the method further includes retrieving the positioning rod after the positioning rod reaches the end of the slot.

According to the claimed invention, assembling the second component set on the second region of the circuit board includes setting the second component set on the second region of the circuit board with surface mounting technology.

According to the claimed invention, assembling the second component set on the second region of the circuit board includes setting the second component set on the second region of the circuit board by a component placement machine.

According to the claimed invention, the method further includes detecting whether the circuit board is positioned correctly.

According to the claimed invention, a circuit board assembling system includes a circuit board whereon a slot is formed, the circuit board comprising a first region and a second region, a component placement machine for assembling components on the circuit board, a positioning rod disposed on a positioning point in a adjustable manner, wherein a first width of the unadjusted positioning rod is larger than a width of the slot so that the unadjusted positioning rod can not pass through the slot, a conveying device for driving the circuit board to the positioning point in a first direction and driving the circuit board to an assembling position in a second direction different from the first direction, and a control unit for controlling the conveying device to drive the circuit board to the assembling position in the second direction and controlling the component placement machine to assemble a first component set on the first region of the circuit board when the circuit board is blocked at the positioning point by the positioning rod, for controlling the positioning rod to be adjusted from the first width to a second width being smaller than the width of the slot, for controlling the conveying device to drive the circuit board back to the positioning point and to drive the circuit board in the first direction until the positioning rod reaches an end of the slot after the first component set is assembled on the circuit board, and for controlling the conveying device to drive the circuit board to the assembling position in the second direction and controlling the component placement machine to assemble a second component set on the second region of the circuit board.

According to the claimed invention, a cut edge is further disposed on the circuit board and formed on a side of the slot.

According to the claimed invention, the component placement machine sets the first component set and the second component set on the first region and the second region of the circuit board with surface mounting technology, respectively.

According to the claimed invention, the component placement machine is a high-speed component placement machine or a general component placement machine.

According to the claimed invention, the positioning rod includes two pivoting components for rotating relative to a shaft so that the positioning rod is folded from the first width to the second width.

According to the claimed invention, the two pivoting components of the positioning rod are for rotating relative to the shaft to the first direction so that the positioning rod is folded from the first width to the second width.

According to the claimed invention, the control unit is for retrieving the positioning rod after the positioning rod reaches the end of the slot.

According to the claimed invention, the circuit board assembling system further includes a detecting unit for detecting whether the circuit board is positioned correctly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
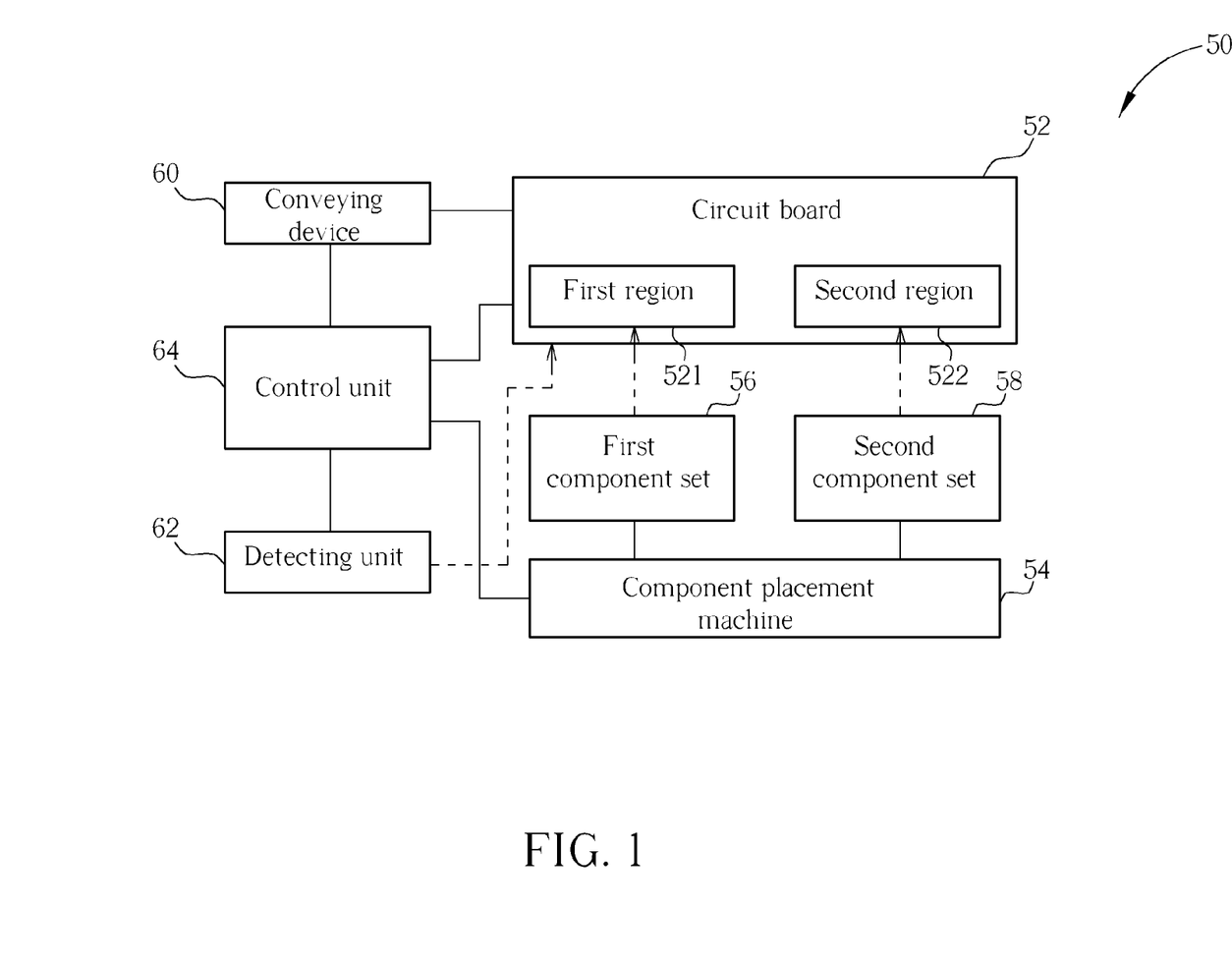
FIG. 1 is a functional block diagram of a circuit board assembling system according to a preferred embodiment of the present invention.

Please refer to FIG. 1. FIG. 1 is a functional block diagram of a circuit board assembling system 50 according to a preferred embodiment of the present invention. The circuit board assembling system 50 includes a circuit board 52, which can be a printed circuit board. The circuit board 52 includes a first region 521 and a second region 522. The circuit board assembling system 50 further includes a component placement machine 54 for assembling components on the circuit board 52. The component placement machine 54 can respectively set a first component set 56 and a second component set 58 on the first region 521 and the second region 522 of the circuit board 52 with surface mounting technology. The component placement machine 54 can be a high-speed component placement machine or a general component placement machine. The circuit board assembling system 50 further includes a conveying device 60 for conveying the circuit board 52 to a positioning point and for conveying the circuit board 52 between the positioning point and an assembling position of the component placement machine 54. The conveying device 60 can be a conveying belt mechanism. The circuit board assembling system 50 further includes a detecting unit 62 for detecting whether the circuit board 52 is positioned correctly. The detecting unit 62 can be an optical sensor. The circuit board assembling system 50 further includes a control unit 64 for controlling the conveying device 60 to drive the circuit board 52 to the assembling position after the detecting unit 62 detects the circuit board 52 is positioned correctly, for controlling the component placement machine 54 to assemble the first component set 56 on the first region 521 of the circuit board 52, for controlling the conveying device 60 to drive the circuit board 52 back to the positioning point after the first component set 56 is assembled on the circuit board 52, and for controlling the conveying device 60 to drive the circuit board 52 to the assembling position and controlling the component placement machine 54 to assemble the second component set 58 on the second region 522 of the circuit board 52. Detailed operational principle of the circuit board assembling system 50 is introduced as follows.

Figure 2:
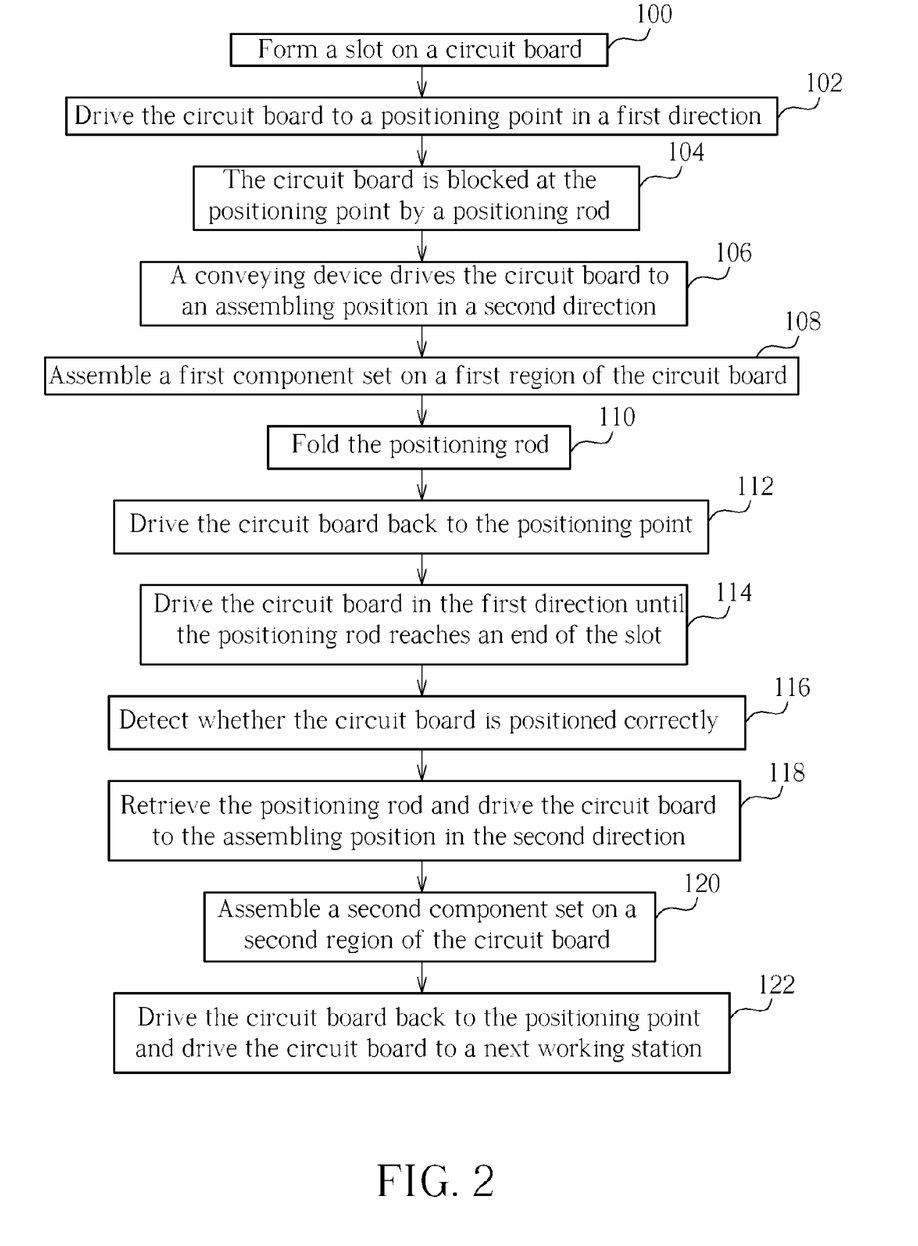
FIG. 2 is a flow chart of assembling the components on a circuit board according to the preferred embodiment of the present invention.
Figure 3:
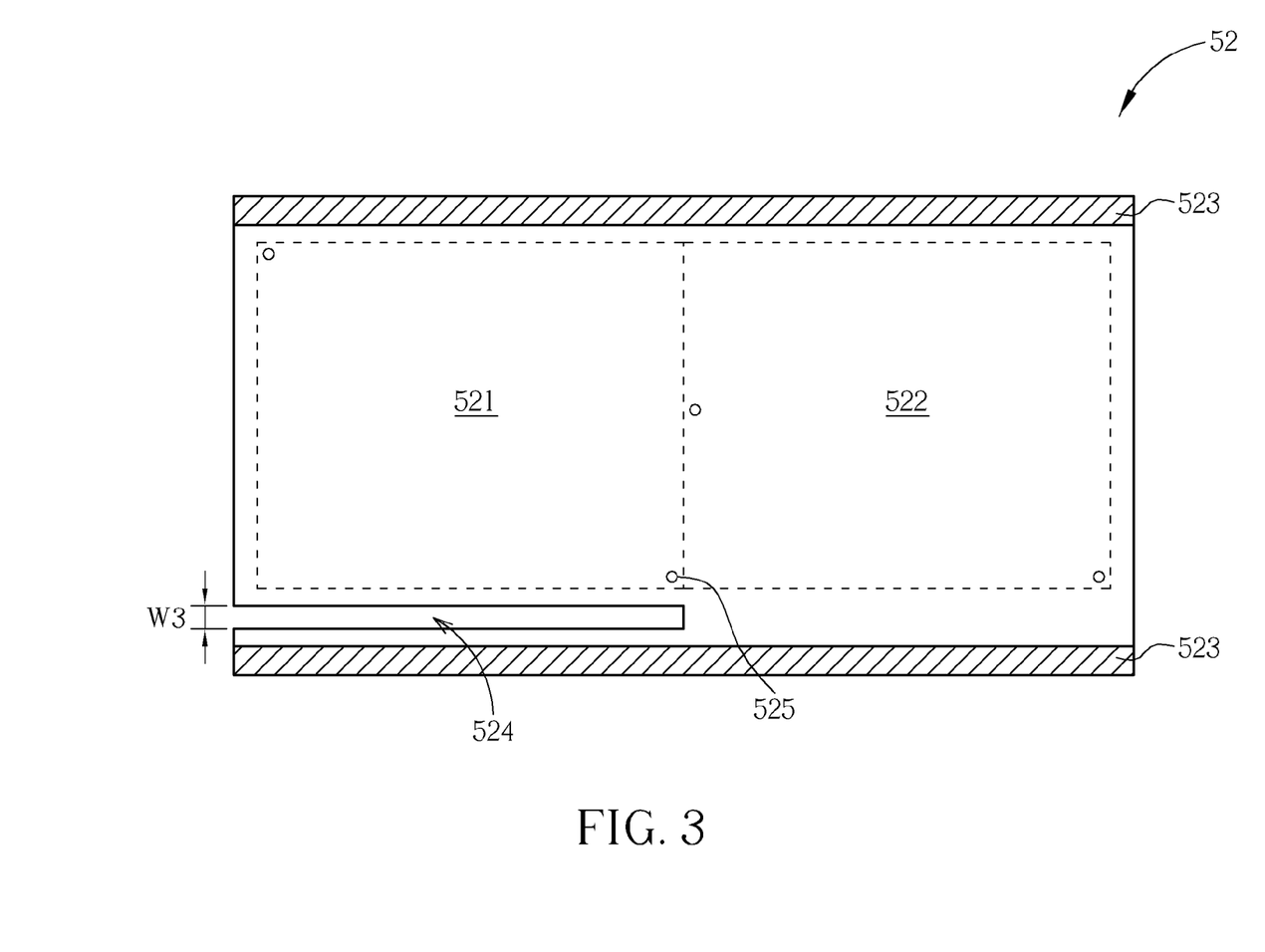
FIG. 3 is a diagram of the circuit board according to the preferred embodiment of the present invention.
Figure 4:
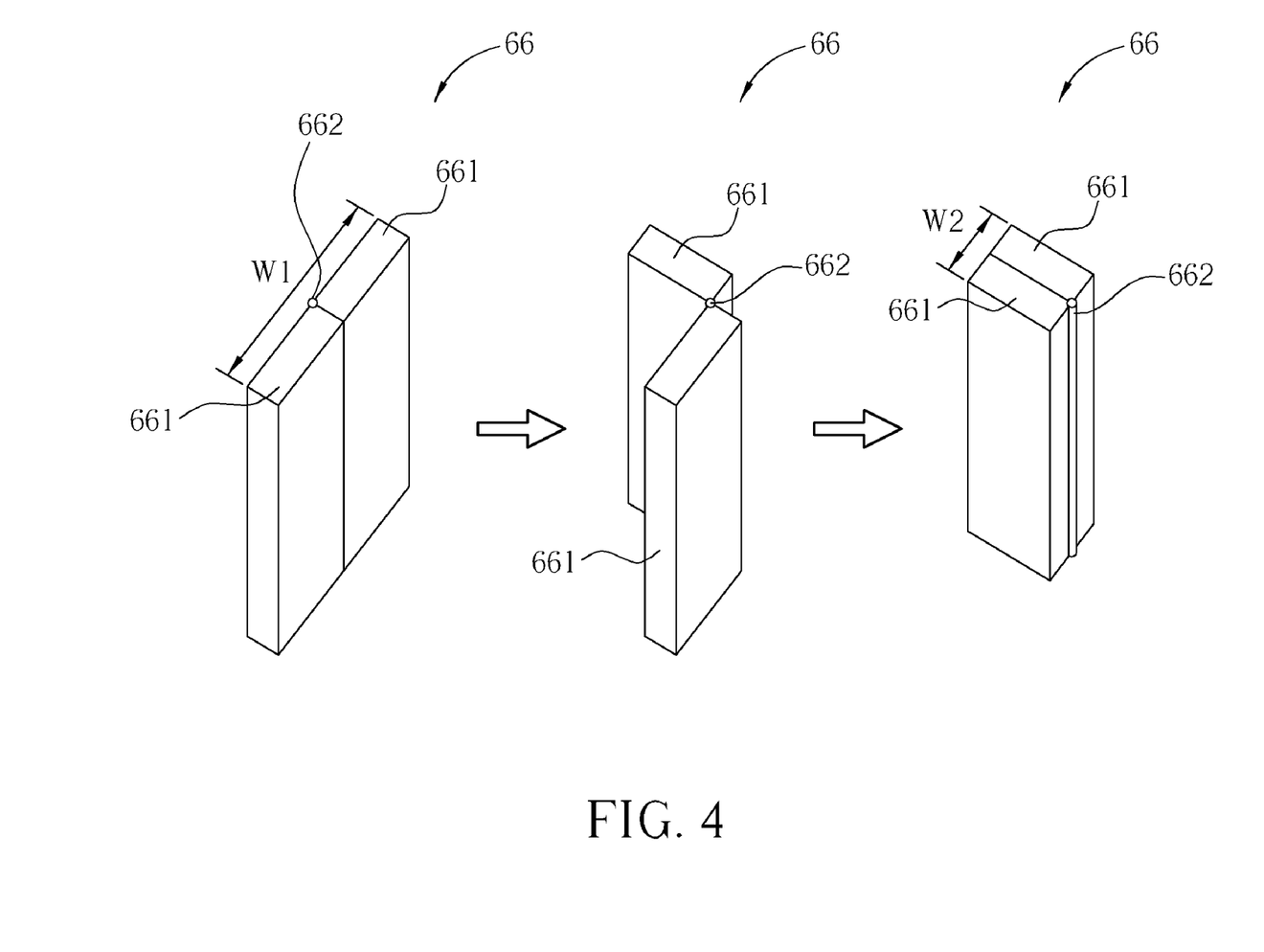
FIG. 4 is a diagram of a positioning rod of the circuit board assembling system according to the preferred embodiment of the present invention.

Please refer to FIG. 1 to FIG. 4. FIG. 2 is a flow chart of assembling the components on the circuit board 52 according to the preferred embodiment of the present invention. FIG. 3 is a diagram of the circuit board 52 according to the preferred embodiment of the present invention. FIG. 4 is a diagram of a positioning rod 66 of the circuit board assembling system 50 according to the preferred embodiment of the present invention. A method for assembling the components on the circuit board 52 includes following steps:

Step 100: Form a slot 524 on a side of a cut edge 523 of the circuit board 52;

Step 102: The control unit 64 controls the conveying device 60 to drive the circuit board 52 to the positioning point in a first direction;

Step 104: When the circuit board 52 is blocked at the positioning point by the positioning rod 66, the detecting unit 62 detects whether the circuit board 52 is positioned correctly. A first width W1 of the unadjusted positioning rod 66 is larger than a width W3 of the slot 524 so that the unadjusted positioning rod 66 can not pass through the slot 524;

Step 106: The control unit 64 controls the conveying device 60 to drive the circuit board 52 to the assembling position in a second direction different from the first direction after the circuit board 52 is positioned correctly;

Step 108: When the circuit board 52 is in the assembling position, the control unit 64 controls the component placement machine 54 to assemble the first component set 56 on the first region 521 of the circuit board 52;

Step 110: Fold the positioning rod 66 to a second width W2 smaller than the first width W1. The second width W2 is smaller than the width W3 of the slot 524;

Step 112: The control unit 64 controls the conveying device 60 to drive the circuit board 52 back to the positioning point after the component placement machine 54 assembles the first component set 56 on the first region 521 of the circuit board 52;

Step 114: The control unit 64 controls the conveying device 60 to drive the circuit board 52 in the first direction until the positioning rod 66 reaches an end of the slot 524;

Step 116: When the positioning rod 66 reaches the end of the slot 524, the detecting unit 62 detects whether the circuit board 52 is positioned correctly;

Step 118: Retrieve the positioning rod 66 after the circuit board 52 is positioned correctly and the control unit 64 controls the conveying device 60 to drive the circuit board 52 to the assembling position in the second direction;

Step 120: When the circuit board 52 is in the assembling position, the control unit 64 controls the component placement machine 54 to assemble the second component set 58 on the second region 522 of the circuit board 52; and Step 122: After the component placement machine 54 assembles the second component set 58 on the second region 522 of the circuit board 52, the control unit 64 controls the conveying device 60 to drive the circuit board 52 back to the positioning point and to drive the circuit board 52 to a next working station.

Figure 5:
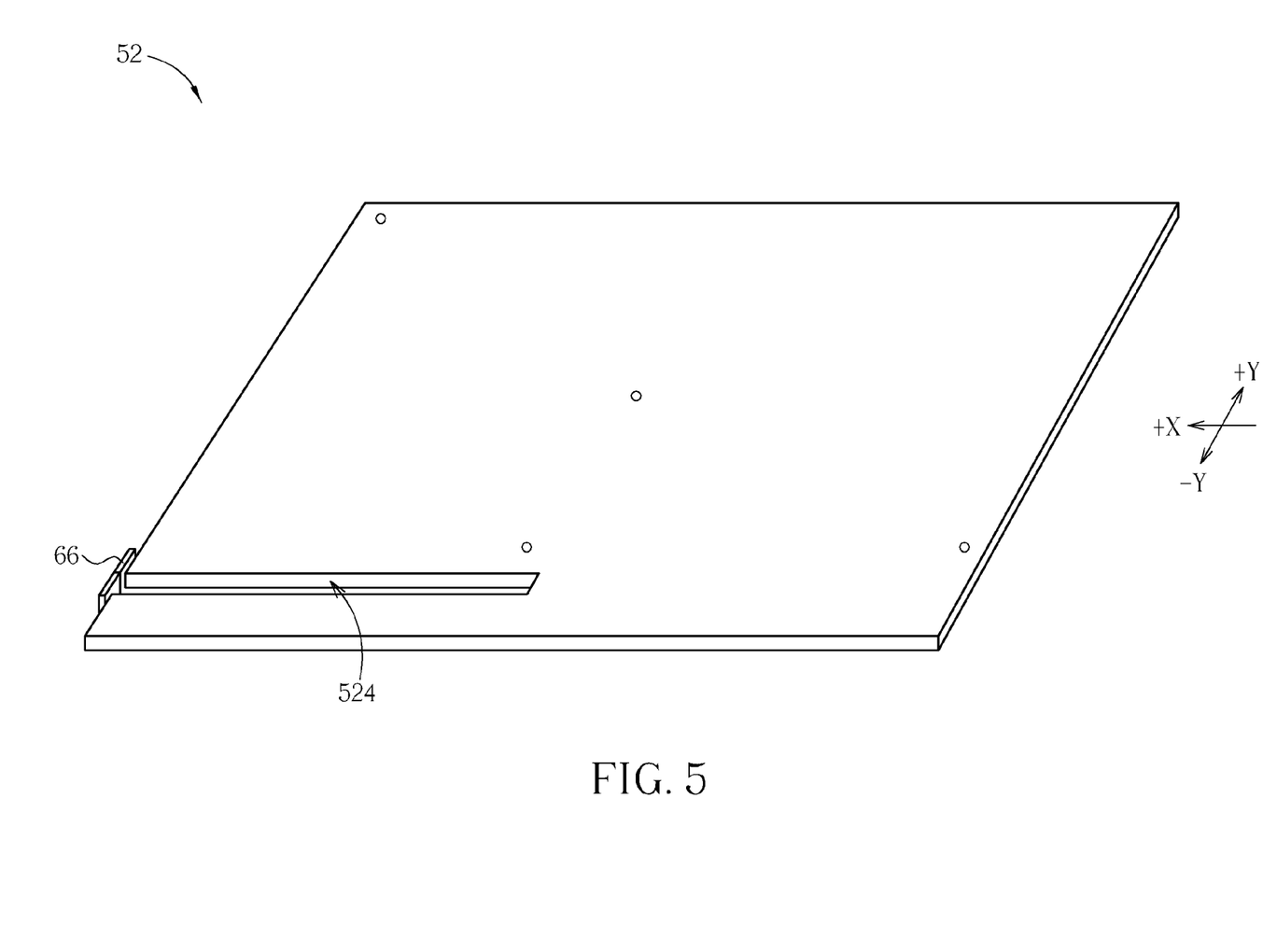
FIG. 5 to FIG. 12 are diagrams of assembling the components on the circuit board according to the preferred embodiment of the present invention.
Figure 6:
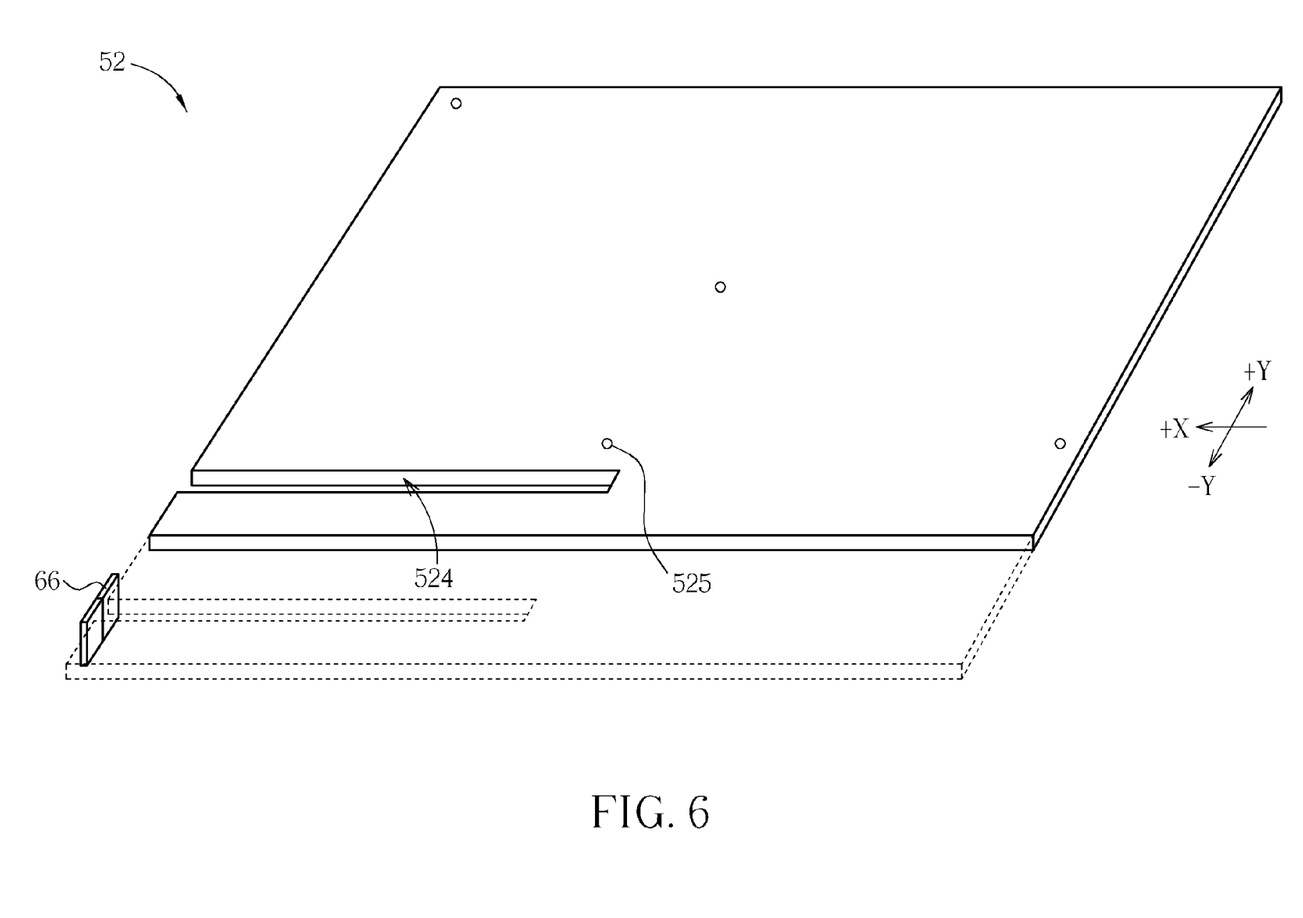
Figure 7:
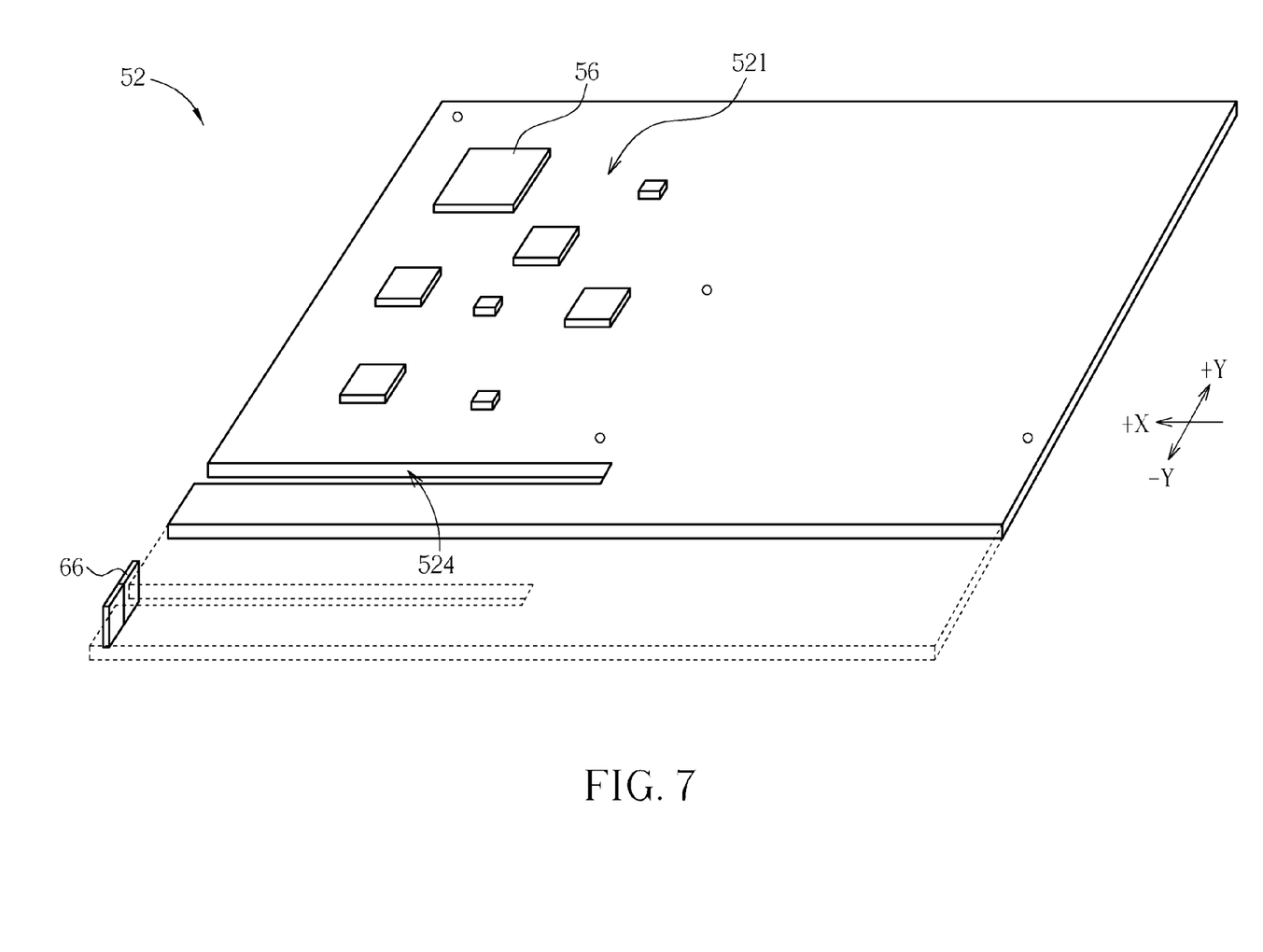

Please refer to FIG. 1 and FIG. 5 to FIG. 12. FIG. 5 to FIG. 12 are diagrams of assembling the components on the circuit board 52 according to the preferred embodiment of the present invention. First, in step 100, the slot 524 is formed on an inner side of the cut edge 523 of the circuit board 52 shown in FIG. 3. The cut edge 523 of the circuit board 52 is the position where a track of the conveying device 60 clips the circuit board 52, and the cut edge 523 is cut off after the circuit board 52 is made-up. In step 102, the circuit board 52 processed with solder printing and solder printing detection moves toward the component placement machine 54. As shown in FIG. 5, the control unit 64 controls the conveying device 60 to drive the circuit board 52 to the positioning point where the positioning rod 66 is positioned in the first direction (X direction). In step 104, because the first width W1 of the unadjusted positioning rod 66 is larger than the width W3 of the slot 524, the circuit board 52 is blocked at the positioning point by the positioning rod 66 so that the positioning rod 66 can not pass through the slot 524. As this time, the detecting unit 62 detects whether the circuit board 52 is the right one and whether the circuit board 52 is positioned correctly. The detecting unit 62 can be operated selectively, which means this detecting process can be omitted. In step 106, the detecting unit 62 detects the circuit board 52 is positioned correctly and outputs a corresponding detecting signal to the control unit 64. After the control unit 64 determines the circuit board 52 is the right one and is positioned correctly, as shown in FIG. 6, the control unit 64 controls the conveying device 60 to drive the circuit board 52 to the assembling position where the component placement machine 54 sets the components on in the second direction (+Y direction) different from the first direction. The first direction can be perpendicular to the second direction substantially. As shown in FIG. 7, in step 108, when the circuit board 52 is positioned in the assembling position, the component placement machine 54 detects at least one optical positioning point 525 on the circuit board 52 so as to position the setting position accurately. Then, the control unit 64 controls the component placement machine 54 to assemble the first component set 56 on the first region 521 of the circuit board 52, so that a first phase of the setting process of the circuit board 52 is completed.

Meanwhile, in step 110, the positioning rod 66 is fold from the first width W1 to the second width W2 smaller than the first width W1. The second width W2 is smaller than the width W3 of the slot 524. One of folding methods of the positioning rod 66 is shown in FIG. 4. The positioning rod 66 can include two pivoting components 661 pivoting to each other for rotating relative to a shaft 662, such as rotating to the first direction relative to the shaft 662, so that the folded positioning rod 66 can recede a few distance toward the first direction relative to the original positioning point to avoid interference generated by the circuit board 52 not being positioned on the positioning point correctly due to assembly tolerance. For example, the width W3 of the slot 524 can be 8 mm, the original width (the first width W1) of the positioning rod 66 can be 12 mm, and the original thickness of the positioning rod 66 can be 2 mm. A tolerance of 4 mm between the first width W1 and the width W3 of the slot 524 is reserved. The width of the folded positioning rod 66 is 4 mm (the second width W2). Therefore, the tolerance of 4 mm is also reserved between the width W3 of the slot 524 and the second width W2 for ensuring stable manufacture with high precise tolerance of the track. In addition, the folded positioning rod 66 can recede 2 mm toward the first direction relative to the original positioning point so as to ensure that the circuit board 52 is not broken by hitting the positioning rod 66 after the circuit board 52 is back to the positioning point. Mechanical design for adjusting the positioning rod 66 form the first width W1 to the second width W2 smaller than the first width W1 is not limited by a folding manner. For example, it can be operated in a retractable manner, the mechanical design capable of adjusting the width of the positioning rod 66 belongs to the scope of the present invention.

Figure 8:
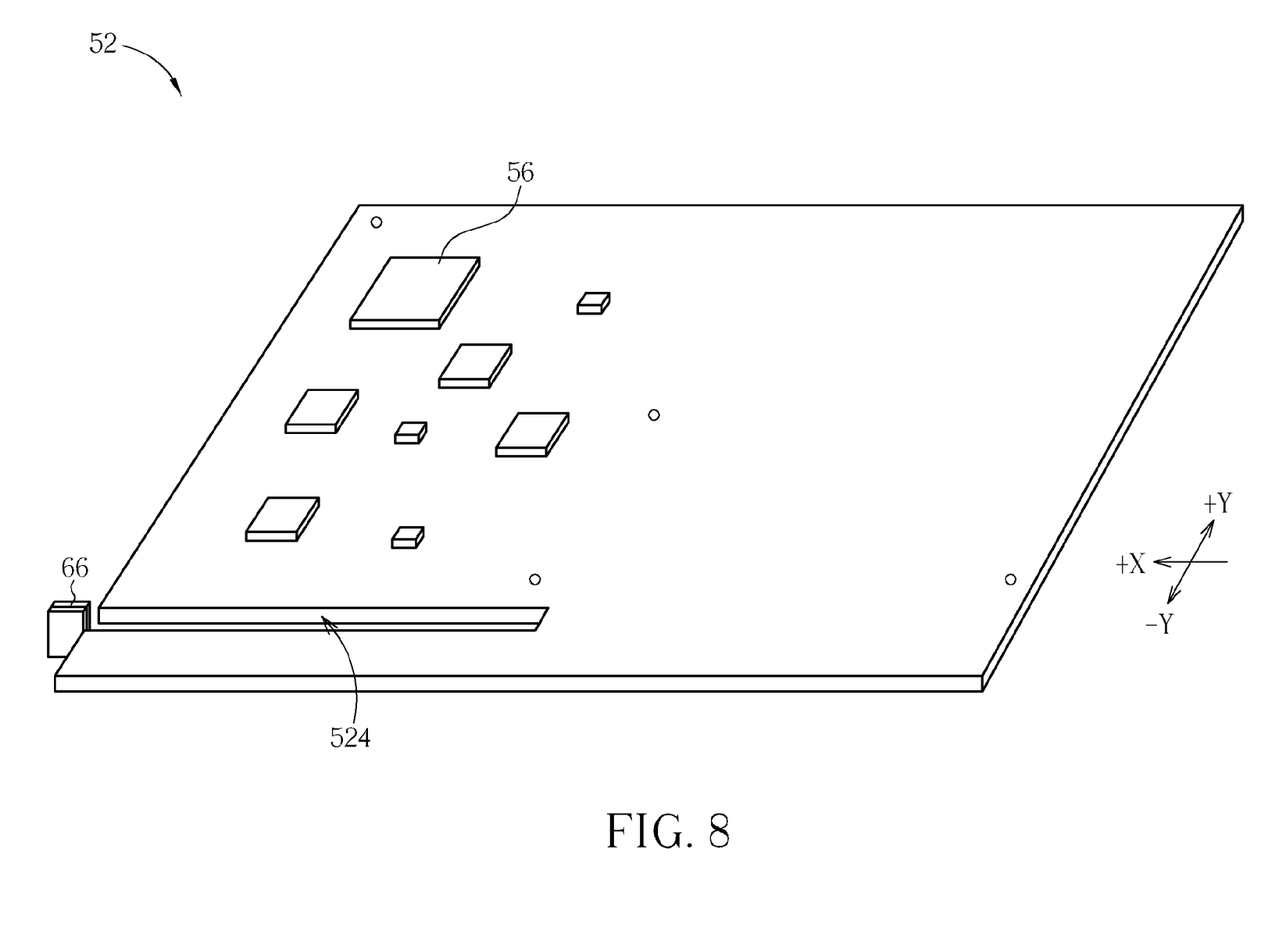
Figure 9:
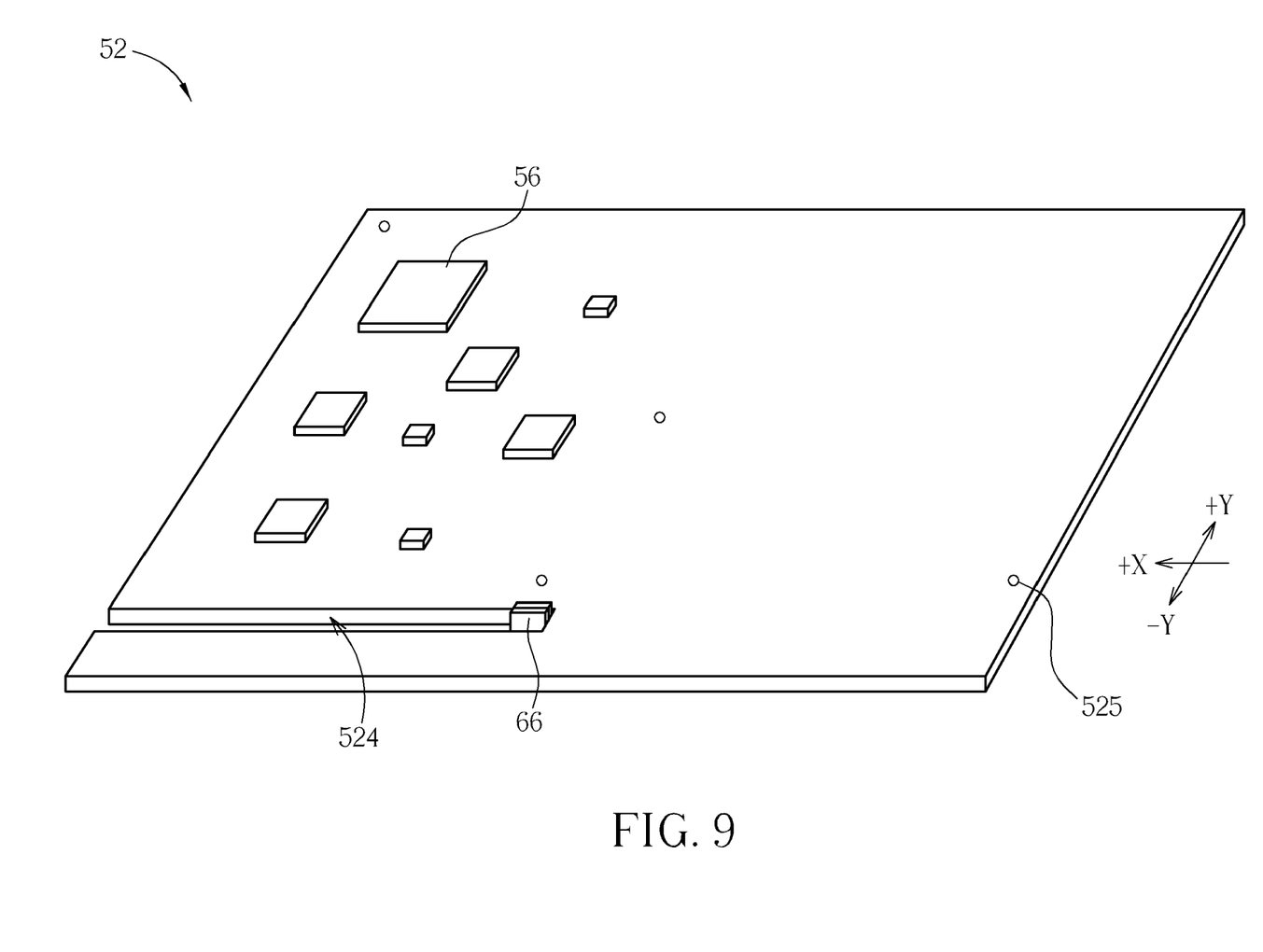

As shown in FIG. 8, in step 112, after the component placement machine 54 assembles the first component set 56 on the first region 521 of the circuit board 52, the control unit 64 controls the conveying device 60 to drive the circuit board 52 back to the positioning point again in a direction opposite to the second direction (−Y direction). As this time, the folded positioning rod 66 aligns to the slot 524 of the circuit board 52. As shown in FIG. 9, in step 114, the control unit 64 controls the conveying device 60 to drive the circuit board 52 in the first direction (+X direction). Because the second width W2 of the folded positioning rod 66 is smaller than the width W3 of the slot 524, the circuit board 52 can not be blocked by the positioning rod 66, and the circuit board 52 can move toward the first direction (+X direction) continuously until the positioning rod 66 moves to the end of the slot 524. The positioning rod 66 is against the end of the slot 524 of the circuit board 52. Meanwhile, the detecting unit 62 can detect whether the circuit board 52 exists and whether the circuit board 52 is positioned correctly. The detecting unit 62 can be operated selectively, which means the detecting process can be omitted.

Figure 10:
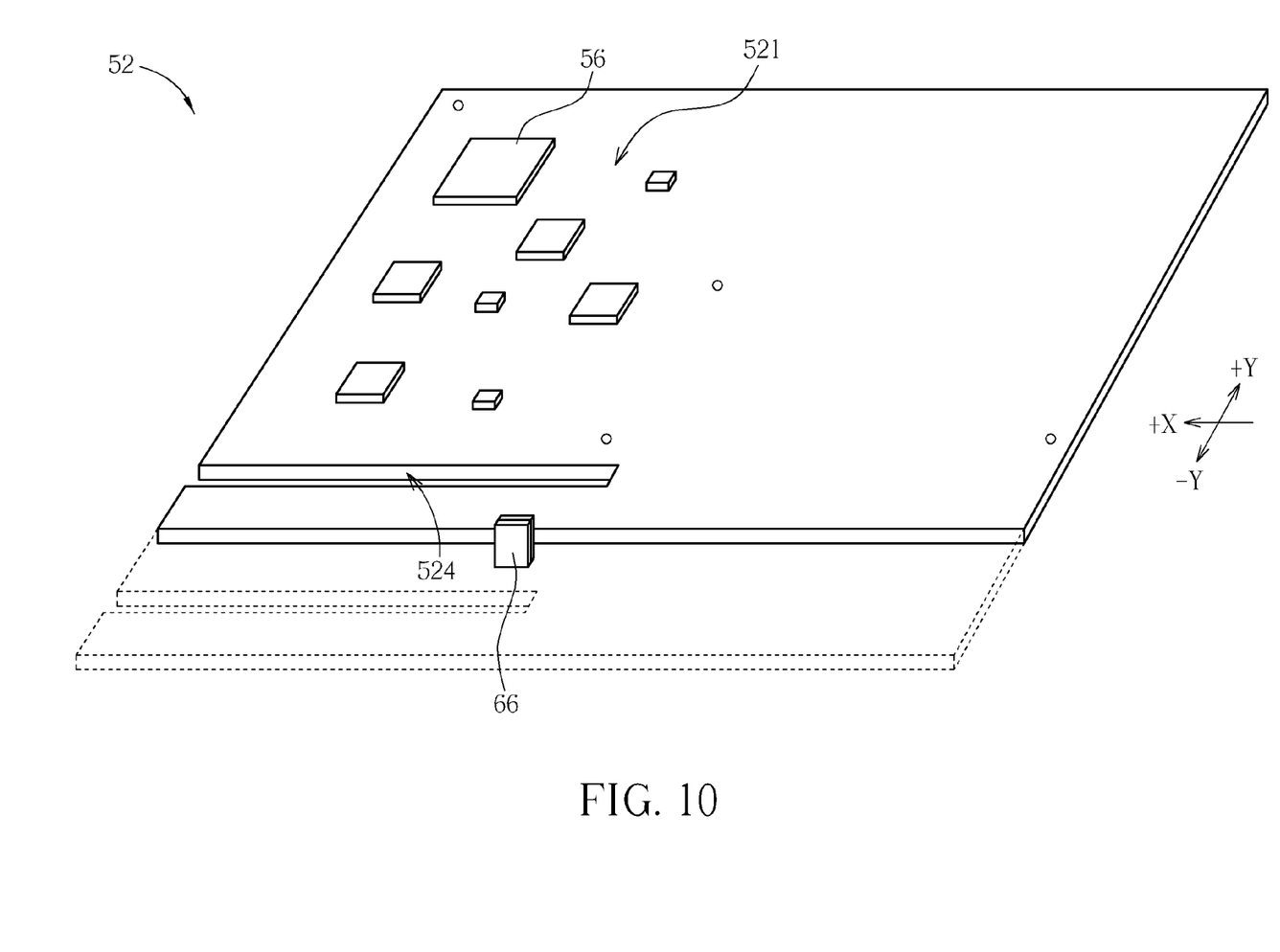
Figure 11:
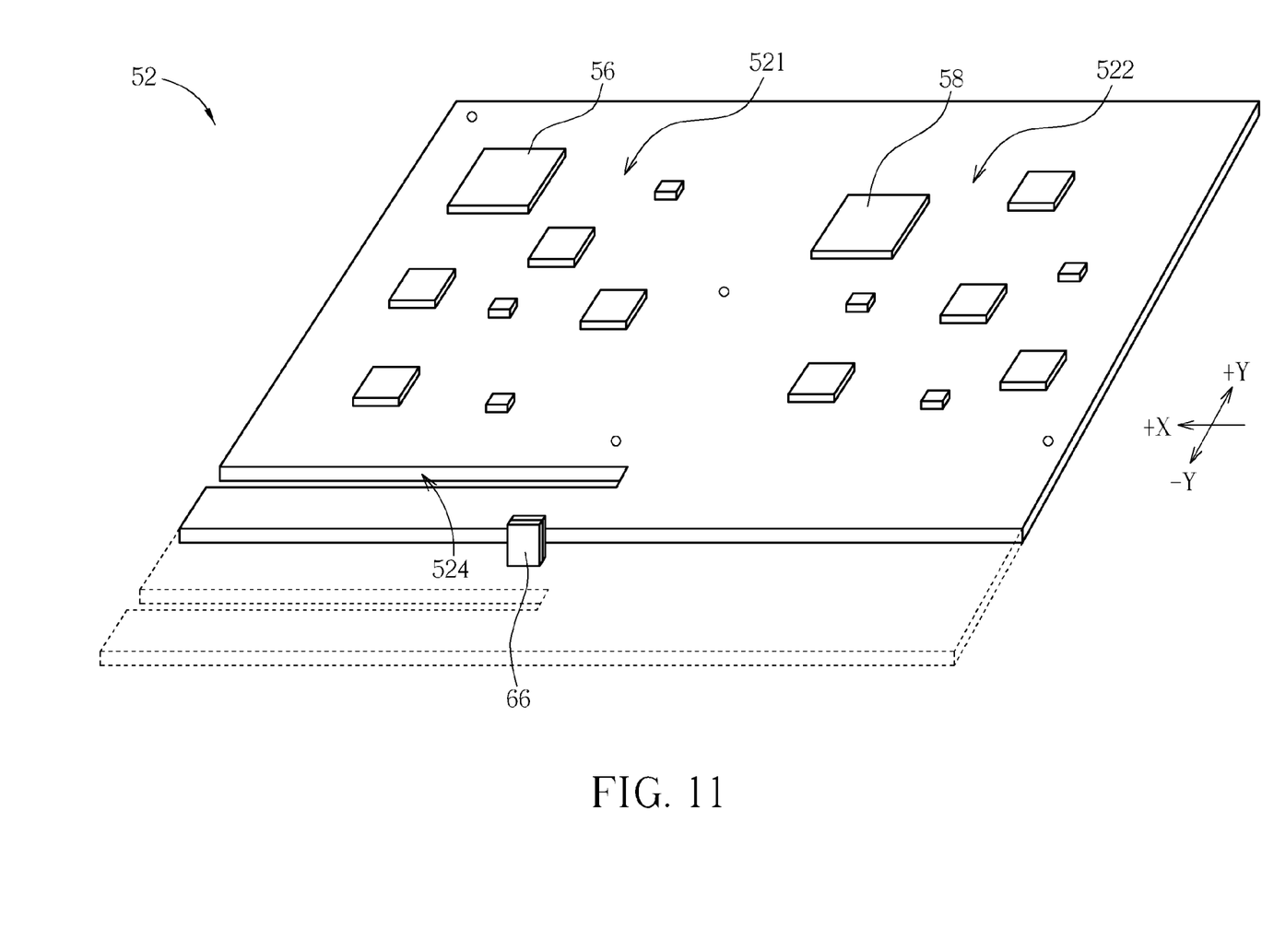
Figure 12:
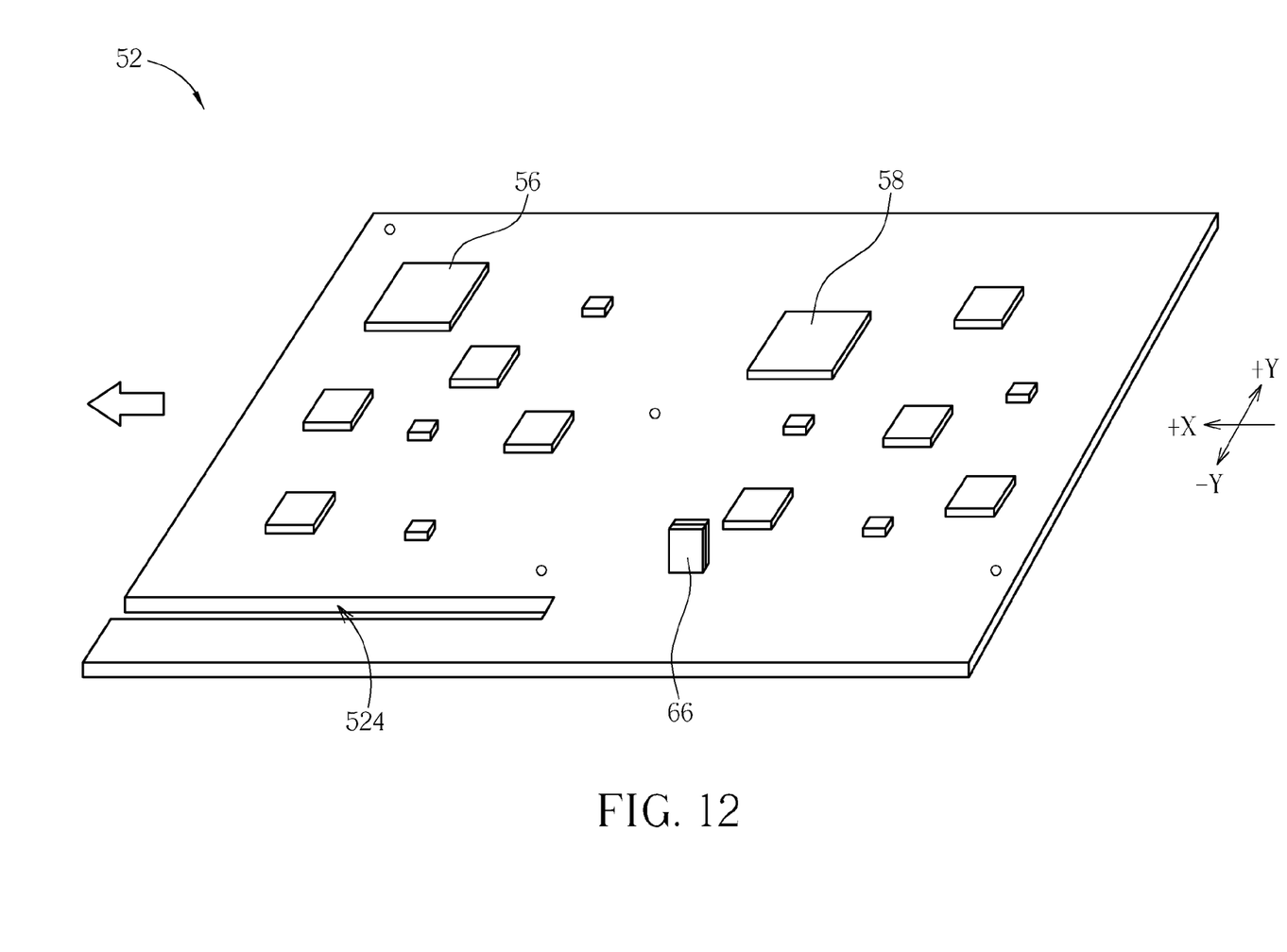

Similarly with the above-mentioned operational principle, in step 118, the detecting unit 62 detects the circuit board 52 is positioned correctly and outputs the corresponding detecting signal to the control unit 64. After the control unit 64 determines the circuit board 52 is positioned correctly, as shown in FIG. 10, the positioning rod 66 is retrieved, and the control unit 64 controls the conveying device 60 to drive the circuit board 52 to the assembling position where the component placement machine 54 sets the components on in the second direction (+Y direction). Method of retrieving the positioning rod 66 can be moving the positioning rod 66 away from the slot 524, or can design a retractable mechanism for retracting the positioning rod 66. The present invention also can replace the mechanism of retrieving the positioning rod 66 by moving the circuit board 52 away to a position without interfering with the positioning rod 66 so as to drive the circuit board 52 to the assembling position successfully. As shown in FIG. 11, in step 120, when the circuit board 52 is positioned on the assembling position, the component placement machine 54 can detect the optical positioning point 525 on the circuit board 52 so as to position the setting position accurately. Then, the control unit 64 controls the component placement machine 54 to assemble the second component set 58 on the second region 522 of the circuit board 52, so that a second phase of the setting process of the circuit board 52 is completed. As shown in FIG. 12, in step 122, after the component placement machine 54 assembles the second component set 58 on the second region 522 of the circuit board 52, the control unit 64 controls the conveying device 60 to drive the circuit board 52 back to the positioning point again in the direction opposite to the second direction (−Y direction) and to drive the circuit board 52 to the next working station, so the setting process of the circuit board 52 is fully completed. For assembling the next circuit board, the process from step 100 to step 122 can be repeated continuously so as to achieve a purpose of automatically executing surface mounting process on the circuit boards with large dimensions.

In conclusion, the present invention merely utilizes one component placement machine to execute two phases setting process. Therefore, the present invention can overcome limitation of the conventional equipment for manufacturing the circuit boards with large dimensions without adding the extra equipment, and can promote utility rate of the equipment, decrease cost of the equipment, and improve manufacturing efficiency. In addition, dimensional limitation can be solved so that new products can be manufactured and designed without limitation. For example, the same products can be integrated into one circuit board and the process can speed up. Furthermore, the present invention can further design an application of multi-phase setting process, which means a plurality of slots can be disposed on the circuit board and the multi-phase setting process can be executed on the same circuit board. The operational principle is the same as the above-mentioned embodiment and detailed description is omitted herein for simplicity.

Comparing to the prior art, the circuit board assembling technology of the present invention can overcome the limitation of the conventional equipment and can manufacture the circuit board with large dimensions without adding the extra equipment so as to promote the utility rate of the equipment, to decrease the cost of the equipment, and to improve the manufacturing efficiency.

Those skilled in the art will readily observe that numerous modifications and alterations of the device and method may be made while retaining the teachings of the invention.

What is claimed is:

1. A circuit board assembling system comprising:
    a circuit board whereon a slot is formed, the circuit board comprising a first region and a second region;
    a component placement machine for assembling components on the circuit board;
    a positioning rod disposed on a positioning point in a adjustable manner, wherein a first width of the unadjusted positioning rod is larger than a width of the slot so that the unadjusted positioning rod can not pass through the slot;
    a conveying device for driving the circuit board to the positioning point in a first direction and driving the circuit board to an assembling position in a second direction different from the first direction; and
    a control unit for controlling the conveying device to drive the circuit board to the assembling position in the second direction and controlling the component placement machine to assemble a first component set on the first region of the circuit board when the circuit board is blocked at the positioning point by the positioning rod, for controlling the positioning rod to be adjusted from the first width to a second width being smaller than the width of the slot, for controlling the conveying device to drive the circuit board back to the positioning point and to drive the circuit board in the first direction until the positioning rod reaches an end of the slot after the first component set is assembled on the circuit board, and for controlling the conveying device to drive the circuit board to the assembling position in the second direction and controlling the component placement machine to assemble a second component set on the second region of the circuit board.

2. The circuit board assembling system of claim 1, wherein a cut edge is further disposed on the circuit board and formed on a side of the slot.

3. The circuit board assembling system of claim 1, wherein the first direction is perpendicular to the second direction substantially.

4. The circuit board assembling system of claim 1, wherein the component placement machine sets the first component set and the second component set on the first region and the second region of the circuit board with surface mounting technology, respectively.

5. The circuit board assembling system of claim 1, wherein the component placement machine is a high-speed component placement machine or a general component placement machine.

6. The circuit board assembling system of claim 1, wherein the positioning rod comprises two pivoting components for rotating relative to a shaft so that the positioning rod is folded from the first width to the second width.

7. The circuit board assembling system of claim 6, wherein the two pivoting components of the positioning rod are for rotating relative to the shaft to the first direction so that the positioning rod is folded from the first width to the second width.

8. The circuit board assembling system of claim 1, wherein the control unit is for retrieving the positioning rod after the positioning rod reaches the end of the slot.

9. The circuit board assembling system of claim 1 further comprising:
    a detecting unit for detecting whether the circuit board is positioned correctly.

* * * * *